United States Patent [19]

Bobenrieth

[11] 4,069,493

[45] Jan. 17, 1978

[54] NOVEL INTEGRATED CIRCUIT AND METHOD OF MANUFACTURING SAME

[75] Inventor: Albert Bobenrieth, Paris, France

[73] Assignee: Thomson-CSF, Paris Cedex, France

[21] Appl. No.: 680,572

[22] Filed: Apr. 26, 1976

Related U.S. Application Data

[63] Continuation of Ser. No. 468,089, May 8, 1974, abandoned.

[30] Foreign Application Priority Data

Oct. 2, 1970 France .................. 70.35702

[51] Int. Cl.² .................. H01L 29/80; H01L 29/48; H01L 27/02; H01L 29/78
[52] U.S. Cl. .................. 357/22; 357/23; 357/41; 357/51; 357/15; 357/88; 357/91
[58] Field of Search .................. 357/22, 15, 23, 41, 357/51, 88, 91

[56] References Cited

U.S. PATENT DOCUMENTS

| | | | |
|---|---|---|---|
| 3,413,531 | 11/1968 | Leith | 357/22 |
| 3,761,328 | 9/1973 | Abe et al. | 357/22 |

*Primary Examiner*—Edward J. Wojciechowicz
*Attorney, Agent, or Firm*—Cushman, Darby & Cushman

[57] ABSTRACT

An integrated circuit comprises a high-resistivity substrate 1 which virtually insulates the various integrated components of the circuit from one another and reduces the parasitic capacitances. This components are constituted by ion implantation through high-precision masks, without exceeding 800° C in temperature. This is the case with the source 3, the gate 9 and the drain 4, of the field-effect transistor (shown in FIG. 1).

4 Claims, 3 Drawing Figures

NOVEL INTEGRATED CIRCUIT AND METHOD OF MANUFACTURING SAME

This is a continuation of application Ser. No. 468,089 filed May 8, 1974, now abandoned.

The present invention relates to monolithic integrated circuits, that is to say ones comprising a substrate manufactured from a single block of semiconductor material. The object of the invention is to produce a simpler structure comprising regions which are delimited with an accuracy in the order of one micron, and which lends itself to the production of high-performance electronic circuits operating at frequencies in the order of one Gc/s.

In known monolithic integrated circuit structures, for example, upon a P-doped silicon substrate having a mean resistivity which is generally in the order of 10 ohm-cm, there is deposited an epitaxial N-type layer of lower resistivity, for example 0.5 to 1 ohm-cm. The choice of the magnitude of the resistivity of the substrate is effected with a view to the conventional operations of manufacturing electronic circuits within the body of the integrated circuit.

Amongst these operations, there are the oxidation of the silicon surface and the production by diffusion of regions having a different doping from that of the substrate. The heat-treatments which accompany or follow these operations, are carried out at temperatures ranging from 1000° to 1200° C. The result is that the doping and resistivity of the substrate generally run the risk of varying widely and thus disturbing the proper operation of the electronic circuits, unless the substrate has been given a mean doping level corresponding to a resistivity in the order of that referred to hereinbefore, namely 10 ohm-cm.

The various components of the circuits formed in the epitaxial layer are insulated from one another by diffused insulating "walls".

The following are the chief amongst the drawbacks of this process:
 the need for epitaxy operations and the production of insulating walls (possibly preceded by the deposition of embedded base portions), these, in respect of each integrated electronic component, forming what is called a "box".
 the substantial value of the parasitic capacitances between box and substrates (top and walls), this reducing the performance of the integrated components as compared with the same components when produced individually (in lumped form).
 the substantial value of the distributed capacitances of the diffused resistors, this further reducing the speed of operation of known integrated circuits.
 the lack of accuracy in the lateral and transverse dimensions of the integrated components, which is too poor to enable the production of field-effect transistors or bipolar transistors, which have good characteristics.

The novel integrated circuit in accordance with the invention overcomes these drawbacks.

In accordance with the invention, the integrated circuit comprises regions which are doped to have different conductivity types, these being formed in a substrate, and constituting elements of electronic components; this substrate, being weakly doped, is a semi-insulator, said regions extending to a small depth into said substrate and said components being insulated from one another by the substrate.

The invention will be better understood and certain features concerning the methods of manufacture will be rendered apparent, from a consideration of the ensuing description and by reference to the attached figure in which.

Figure 3:
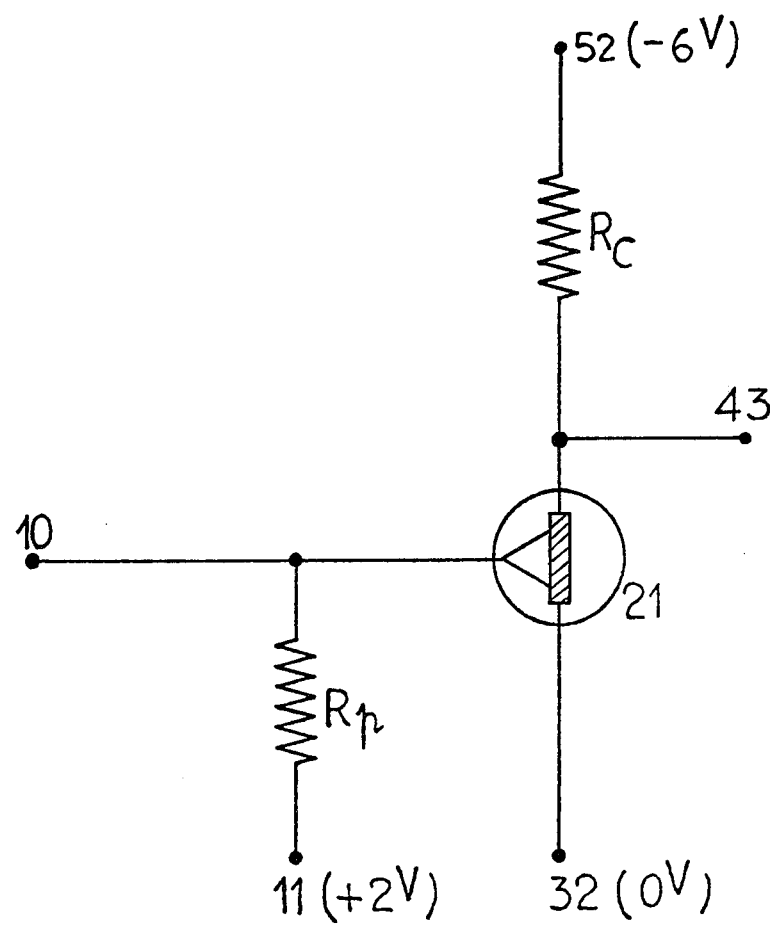

FIG. 3 schematically illustrates the electronic circuit of the preceding figures.

The starting point may be either a P− or N− substrate: the P− substrate has the advantage that it results in an N-type (high mobility) channel in the field-effect transistor, but gives rise to an unwanted inversion layer (N) at the substrate-oxide interface. Although an N− substrate makes it possible to avoid this problem, it gives rise to a P-type channel (poorer mobility) in the transistor. By way of example, the process according to the invention for an N− type substrate will be described.

On a substrate 1 (FIG. 1) constituted for example by N− doped silicon wafer having a thickness in the order of 200 microns and a resistivity in the order of 1000 ohm-cm, there is deposited a layer 2 of silicon dioxide $SiO_2$, the thickness of which is in the order of 0.8 micron. The area illustrated in FIG. 2 is approximately square and has a side length of between 50 and 100 microns.

Figure 1:
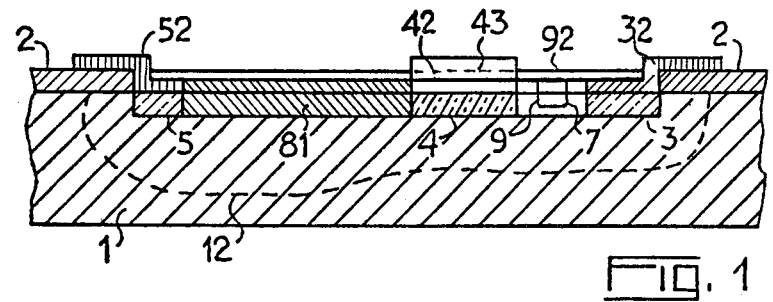
FIG. 1 illustrates a transverse section of an elementary integrated circuit in accordance with the invention, given by way of example.
Figure 2:
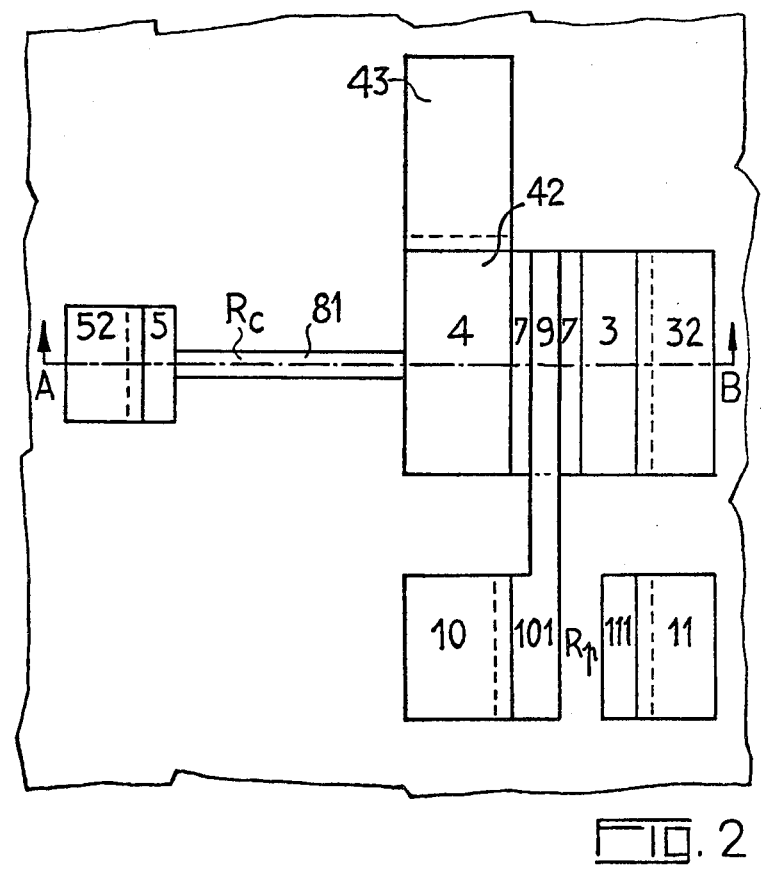
FIG. 2 illustrates a plan view of the elementary integrated circuit of FIG. 1, the line AB marking the line of the plane of section normal to FIG. 2, this being the plane of section for the previous figure.

From right to left (FIGS. 1 and 2), there are shown successively the chief elements of a field-effect transistor comprising a source 3, a gate 9, a drain 4, a load resistor Rc and a bias resistor Rp (visible only in FIG. 2). In details, they are:
 a metal contact 32 and a P+ doped region 3 of the substrate 1, which acts as a source;
 a P-doped zone 7 of the substrate 1, constituting the channel;
 a metal contact 92 and an N+ doped region 9 of the substrate 1, acting as a gate, the contact 92 extending into an enlarged area where it forms a contact 10 wider than the gate 9, deposited upon a zone 101 where the substrate is exposed, and overlapping onto the oxide to form an input terminal of the circuit;
 a metal contact 42 and a P+ doped region 4 diffused in the substrate 1, this region constituting the drain, a contact 43 extending onto the oxide, this contact being connected to the contact 42;
 a load resistor Rc constituted by a P-doped region 81 of the substrate 1;
 a metal contact 52 and a P+ doped region 5 diffused in the substrate 1, the whole constituting an input terminal for the supply which takes the form of a direct voltage source supplying a d.c. voltage equal for example to 6 volts, whose negative terminal is connected to the contact 52 and whose positive terminal to the contact 32 of the source 3, and earthed;
 a metal contact 11 deposited upon a zone 111 overlapping onto the oxide (FIG. 2) and connected to the bias source (+ 2 volts). The part of the substrate between the zones 101 et 111 constitutes the bias resistor Rp.

FIG. 3 schematically illustrates the thus constituted elementary circuit of which the field-effect transistor 21 is the chief component. Considering this circuit in more detail, we find:

the gate input at the terminal 10;
the drain output at the terminal 43;
the source earth connection 32;
a + 2 volts bias at the terminal 11 of the bias resistor Rp, constituted by the substrate section between the terminals 101 and 111;
the negative pole of the d.c. supply at the terminal 52 and the positive side to earth at 32.

A possible method of manufacturing the integrated circuit in accordance with the invention comprises the following stages:

1. the deposition, by cathode-sputtering, of a layer of silicon dioxide in order to form the layer 2 which is 4.8 microns in thickness. It should be noted that this result can equally well be obtained by controlled oxidation in a wet steam atmosphere at a temperature of 1000° C, and that this variant embodiment of the present stage is compatible with the resistivity of the substrate 1 or at any rate only alters it by a negligible amount.

2. high-accuracy electronic masking and etching of the zones 3, 4 and 5 in order to lay bare the substrate 1 in said zone. The high-accuracy electronic masking, as well known in the art, is obtained by a scanning electron microscope, in which the object is replaced by the sample being etched, which is covered with a resin which is polymerised or depolymerised by the electrons of the beam. The beam intensity is modulated in all-or-nothing fashion as a function of its position, by analogue or digital data translating the configuration of the mask which is to be reproduced.

3. introduction of P-type impurities, for example boron ions, by ion bombardment at a density in the order of $10^{16}$ ions per $cm^3$ and an energy in the order of 150,000 electron-volts. The depth of the implanted region will be in the order of one micron and its mean concentration in boron ions in the order of $10^{20}$ ions per $cm^3$ (P+ type doping). In this fashion, the regions 3, 4 and 5 of FIG. 1 are obtained.

4. high-accuracy electronic masking and etching of a window delimiting the zone 7, the future zone 9 and the zone of Rc (shown in FIG. 2).

5. implantation in a manner similar to that described in the case of stage 3), by ion bombardment at the same energy but this time with a density in the order of $10^{12}$ boron ions per $cm^3$, in order to obtain the P-doped regions 7 and 8 of FIG. 1 (concentration of $10^{16}$ ions/$cm^3$).

6. baking for around one hour at 800° C in order to promote the internal reconstitution of the silicon crystal lattice.

7. deposition by cathode-sputtering, of a silicon dioxide layer in order to reconstitute the layer 2, which has a minimum thickness of 0.5 micron, in the zones 3, 4, 5, 7 and Rc.

8. high-accuracy electronic masking and etching of windows delimiting the zone 9, 101 and 111 (FIG. 2).

9. implantation of phosphorus ions at an energy of around 100,000 electron-volts and a density of $10^{16}$ ions/$cm^3$, in order to obtain the approximately 0.5 micron thick N+ doped region 9 with a doping concentration of $2.10^{20}$ per $cm^3$, this region constituting the gate, and the ohmic contacts with the substrate, which delimit Rp (zones 101 and 111).

10. annealing at 800° C.

11. high-accuracy electronic masking and etching of windows which delimit the zones 3, 4 and 5, in order to bare the substrate 1 in said zones.

12. deposition of a layer of aluminum for example, by vaporisation under vacuo.

13. electronic masking to preserve the zones 3, 32, 4, 5, 9, 52, 101, 111 and etching of the wafer carrying the set of integrated circuits, in order to define the connections and contacts.

In addition to the eradication of the drawbacks of the older types of structures referred to hereinbefore, the invention offers the following advantages:

a. It is readily possible to obtain high resistances, something which is useful, if circuits with very low power consumption are to be obtained. Thus, in the circuit of FIG. 3, for a resistor Rc of $5.10^4$ ohms resistance and a resistor Rp of 1 megohm resistance, a consumption in the order of half a milliwatt will be obtained. This power consumption can be still further reduced by producing a resistor Rc of even higher resistance, this by using for the manufacture of Rc, the same process used for Rp, that is to say by constituting Rc by a portion of the substrate. It is then necessary to arrange for a kind of geometry which limits the electrical interaction between Rc and Rp. Conversely, Rp can be produced by masking and the implantation of ions, at the same time as Rc.

b. A pinch-off voltage, i.e. at which the field-effect transistor drops, in the order of around 1 volt can be obtained. In other words, for a channel thickness (channel 7) of 0.4 micron and a concentration in the order of $10^{16}$ boron ions per $cm^3$, calculation shows that the pinch-off voltage is around 1 volt and thus in the same order as the "knee voltage" of a junction transistor.

c. A field-effect transistor structure in accordance with the invention can be operated satisfactorily at frequencies in the order of one Gc/s. In other words, for a gate length of 2 microns and a channel of 0.4 micron, calculation of the theoretical gain-bandwidth product gives a result in the order of 2 Gc/s and satisfactory operation at around 1 Gc/s is virtually assured.

d. Logic circuits of very low power consumption can be produced, since the saturation point in the channel is very low. In other words, for a channel width in the order of 30 microns and a saturation current per unit width of the channel, of 0.03 A/cm, at zero gate voltage, calculation gives a consumption in the order of 100 microamps.

e. The parasitic capacitances are produced by using a substrate having a resistivity which is 100 to 1000 times higher than in a conventional integrated circuit. Hence, the parasitic capacitances become negligible and the characteristics of the integrated components are in the same class as those of lumped components.

The novel integrated circuit and the steps taken to manufacture it, as set out in the foregoing description, have been given here purely by way of example.

In particular, gates of the Schottky type (metal-semiconductor junction) could be used instead of the implanted gates. In the case of an N-type channel (P− substrate) these gates can be produced at the same time as the aluminum interconnections. In addition, the suppression or breaking of the N-type inversion layer, the silicon P− substrate interface can be achieved by other methods than that of the P+ type frame referred to hereinbefore.

Finally, the invention is applicable to the case of integrated circuits utilising a semiconductor other than silicon.

What I claim is:

1. A field effect transistor comprising:
   a weakly doped semiconductive substrate of a first conductivity type having a substantially plane surface, and, in said substrate, contiguous to said surface;
   a source and a drain region consisting of a first and a second ion implanted regions of a common depth, said common depth being on the order of one micron, said regions being highly doped by impurities of a second conductivity type opposite to said first type;
   a channel region consisting of a third ion implanted region of a common depth as said first and second regions and filling the whole space between said regions, said third region being of said second conductivity type but less doped than said first and second regions;
   a gate region consisting of a fourth ion implanted region, occupying a portion of said third region situated at equal distance of said first and second regions, said fourth region having a depth on the order of 0.5 micron.

2. A field effect transistor comprising:
   a weakly doped semiconductive substrate of a first conductivity type having a substantially plane surface, and
   a source and drain region contiguous to said surface, consisting of a first and a second regions of a common depth ion implanted in said substrate, said common depth being on the order of one micron, said regions being highly doped by impurities of a second conductivity type opposite to said first type;
   a channel region contiguous to said surface, consisting of a third region ion implanted in said substrate, of a common depth as said first and second regions and filling the whole space between said region, said third region being of said second conductivity type but less doped than said first and second regions;
   a Schottky gate occupying a portion of said surface situated at equal distance of said first and second regions.

3. An integrated circuit comprising a field effect transistor as claimed in claim 1, further comprising at least one resistor constituted by a portion of said substrate.

4. An integrated circuit comprising a field effect transistor as claimed in claim 2, further comprising at least one resistor constituted by a portion of substrate.

* * * * *

UNITED STATES PATENT OFFICE
CERTIFICATE OF CORRECTION

Patent No. 4,069,493　　　　　　　　　　　Dated　January 17, 1978

Inventor(s) Albert BOBENRIETH

It is certified that error appears in the above-identified patent and that said Letters Patent are hereby corrected as shown below:

Under "Related U.S. Application Data" should read

"Continuation of Ser. No. 468,089, May 8, 1974, abandoned, which was a division of Ser. No. 183,565, September 24, 1971, abandoned."

In the Specification, Column 1, lines 5 and 6 should read

"This is a continuation of application Ser. No. 468,089 filed May 8, 1974, now abandoned, which was a division of Ser. No. 183,565 filed September 24, 1971, abandoned."

Signed and Sealed this

Twenty-third Day of May 1978

[SEAL]

Attest:

RUTH C. MASON
Attesting Officer

LUTRELLE F. PARKER
Acting Commissioner of Patents and Trademarks